(12) United States Patent
Huai et al.

(10) Patent No.: US 7,110,287 B2
(45) Date of Patent: Sep. 19, 2006

(54) METHOD AND SYSTEM FOR PROVIDING HEAT ASSISTED SWITCHING OF A MAGNETIC ELEMENT UTILIZING SPIN TRANSFER

(75) Inventors: Yiming Huai, Pleasanton, CA (US); Mahendra Pakala, San Jose, CA (US)

(73) Assignee: Grandis, Inc., Milpitas, CA (US)

( * ) Notice: Subject to any disclaimer, the term of this patent is extended or adjusted under 35 U.S.C. 154(b) by 159 days.

(21) Appl. No.: 10/778,735

(22) Filed: Feb. 13, 2004

(65) Prior Publication Data
US 2005/0180202 A1 Aug. 18, 2005

(51) Int. Cl.
G11C 11/14 (2006.01)
G11C 11/15 (2006.01)

(52) U.S. Cl. ............... 365/171; 365/173; 365/158; 257/295

(58) Field of Classification Search ........... 365/171, 365/173, 158, 87; 327/567; 257/295, 310; 438/3
See application file for complete search history.

(56) References Cited

U.S. PATENT DOCUMENTS

| 5,695,864 | A | 12/1997 | Slonczewski |
| 6,201,673 | B1 * | 3/2001 | Rottmayer et al. ..... 360/324.12 |
| 6,532,164 | B1 | 3/2003 | Redon et al. |
| 6,603,678 | B1 * | 8/2003 | Nickel et al. ............. 365/171 |
| 6,649,960 | B1 * | 11/2003 | Cross .................... 257/296 |
| 6,829,161 | B1 * | 12/2004 | Huai et al. ............... 365/158 |
| 2002/0105827 | A1 | 8/2002 | Redon et al. |
| 2003/0007398 | A1 | 1/2003 | Daughton et al. |
| 2003/0059588 | A1 | 3/2003 | Hannah et al. |
| 2004/0100855 | A1 * | 5/2004 | Saito et al. ............... 365/232 |

OTHER PUBLICATIONS

Stern, N.P.; Barton, A.E.; Sparks, P.D.; Carey, M.J.; Eckert, J.C.; Magnetics Conference, 2002. INTERMAG Europe 2002. Digest of Technical Papers. 2002 IEEE International; Apr. 28-May 2, 2002 p.: EW1.*
J.F. Albert, et al, "Polarized Current Switching of a CO Thin Film Nanomanget", American Institute of Physics, vol. 77, No. 23, Dec. 4, 2000, pp. 3809-3811.
J.A. Katine, et al, "Current-Driven Magnetization Reversal and Spin-Wave Excitations in Co/Cu/Co Pillars", the American Physical Society, vol. 84, No. 14, Apr. 3, 2000, pp. 3149-3151.

(Continued)

Primary Examiner—Richard Elms
Assistant Examiner—Eric J. Wendler
(74) Attorney, Agent, or Firm—Sawyer Law Group LLP

(57) ABSTRACT

A method and system for providing a magnetic element that can be used in a magnetic memory is disclosed. The magnetic element includes pinned, spacer, free, and heat assisted switching layers. The spacer layer resides between the pinned and free layers. The free layer resides between the spacer and heat assisted switching layers. The heat assisted switching layer improves thermal stability of the free layer when the free layer is not being switched, preferably via an exchange coupling. The free layer is switched using spin transfer when a write current is passed through the magnetic element. The write current preferably provides heat that reduces the heat assisted switching layer's stabilization of the free layer. In another aspect, the magnetic element also includes second free, a second spacer, and second pinned layers. The heat assisted switching layer resides between the two free layers, which are magnetostatically coupled.

35 Claims, 9 Drawing Sheets

OTHER PUBLICATIONS

E.G. Myers, et al, "Point-Contact Studies of Current-Controlled Domain Switching in Magnetic Multilayers" Journal of Applied Physics, vol. 87, No. 9, May 1, 2000, pp. 5502-5503.

J.C. Slonczewski, "Theory and Application of Exchange-Driven Switching", IEEE, Apr. 2000, pp. CE-02.

J.C. Slonczewski, "Current-Driven Excitation of Magnetic Multilayers", Journal of Magnetism and Magnetic Materials, 1996, pp. 1.1-1.7.

J.C. Slonczewski, "Conductance and Exchange Coupling of Two Ferromagnets Separated by a Tunneling Barrier", The American Physical Society, vol. 39, No. 10, Apr. 1, 1999, pp. 6995-7002.

J.Z. Sun, "Current-Driven Magnetic Switching in Manganite Trilayer Junctions", Journal of Magnetism and Magnetic Materials, No. 202, 1999, pp. 157-162.

L. Berger, *Emission of spin waves by a magnetic multilayer transversed by a current*, The American Physical Society, Physical Review B, vol. 54, No. 13, Oct. 1996, pp. 9353-9358.

Geoff Anderson, et al., *CoFe/IrMn exchange biased top, bottom, and dual spin valves*, Journal of Applied Physics, vol. 87, No. 9, May 2000, pp. 6889-6991.

Ki-Seok Moon, et al., *PtMn-based spin-dependent tunneling materials with thin alumina barrier fabricated by two-step natural oxidation*, Journal of Applied Physics, vol. 91, No. 10, May 2000, pp. 7965-7967.

G. Tatara, et al., *Domain Wall scattering Explains 300% Ballistic Magnetoconductance of Nanocontacts*, Physical Review Letters, vol. 83, No. 10, Sep. 1999, pp. 2030-2033.

* cited by examiner

US 7,110,287 B2

METHOD AND SYSTEM FOR PROVIDING HEAT ASSISTED SWITCHING OF A MAGNETIC ELEMENT UTILIZING SPIN TRANSFER

FIELD OF THE INVENTION

The present invention relates to magnetic memory systems, and more particularly to a method and system for providing a more thermally stable magnetic element that employs a spin transfer effect in switching, and that can be used in a magnetic memory such as magnetic random access memory ("MRAM").

BACKGROUND OF THE INVENTION

FIGS. 1A and 1B depict conventional magnetic elements 10 and 10'. The conventional magnetic element 10 is a spin valve and includes a conventional antiferromagnetic (AFM) layer 12, a conventional pinned layer 14, a conventional nonmagnetic spacer layer 16 and a conventional free layer 18. Other layers (not shown), such as seed or capping layer may also be used. The conventional pinned layer 14 and the conventional free layer 18 are ferromagnetic. Thus, the conventional free layer 18 is depicted as having a changeable magnetization 19. The conventional nonmagnetic spacer layer 16 is conductive. The AFM layer 12 is used to fix, or pin, the magnetization of the pinned layer 14 in a particular direction. The magnetization of the free layer 18 is free to rotate, typically in response to an external magnetic field. The conventional magnetic element 10' depicted in FIG. 1B is a spin tunneling junction. Portions of the conventional spin tunneling junction 10' are analogous to the conventional spin valve 10. Thus, the conventional magnetic element 10' includes an AFM layer 12', a conventional pinned layer 14', a conventional insulating barrier layer 16' and a conventional free layer 18' having a changeable magnetization 19'. The conventional barrier layer 16' is thin enough for electrons to tunnel through in a conventional spin tunneling junction 10'.

Depending upon the orientations of the magnetization 19/19' of the conventional free layer 18/18' and the conventional pinned layer 14/14', respectively, the resistance of the conventional magnetic element 10/10', respectively, changes. When the magnetization 19/19' of the conventional free layer 18/18' is parallel to the magnetization of the conventional pinned layer 14/14', the resistance of the conventional magnetic element 10/10' is low. When the magnetization 19/19' of the conventional free layer 18/18' is antiparallel to the magnetization of the conventional pinned layer 14/14', the resistance of the conventional magnetic element 10/10' is high.

To sense the resistance of the conventional magnetic element 10/10', current is driven through the conventional magnetic element 10/10'. Typically in memory applications, current is driven in a CPP (current perpendicular to the plane) configuration, perpendicular to the layers of conventional magnetic element 10/10' (up or down, in the z-direction as seen in FIG. 1A or 1B).

In order to overcome certain issues associated with magnetic memories having a higher density of memory cells, spin transfer may be utilized to switch the magnetizations 19/19' of the conventional free layers 10/10'. Spin transfer is described in the context of the conventional magnetic element 10', but is equally applicable to the conventional magnetic element 10. Current knowledge of spin transfer is described in detail in the following publications: J. C. Slonczewski, "Current-driven Excitation of Magnetic Multilayers," *Journal of Magnetism and Magnetic Materials*, vol. 159, p. L1 (1996); L. Berger, "Emission of Spin Waves by a Magnetic Multilayer Traversed by a Current," *Phys. Rev. B*, vol. 54, p. 9353 (1996), and F. J. Albert, J. A. Katine and R. A. Buhrman, "Spin-polarized Current Switching of a Co Thin Film Nanomagnet," *Appl. Phys. Lett., vol.* 77, No. 23, p. 3809 (2000). Thus, the following description of the spin transfer phenomenon is based upon current knowledge and is not intended to limit the scope of the invention.

When a spin-polarized current traverses a magnetic multilayer such as the spin tunneling junction 10' in a CPP configuration, a portion of the spin angular momentum of electrons incident on a ferromagnetic layer may be transferred to the ferromagnetic layer. In particular, electrons incident on the conventional free layer 18' may transfer a portion of their spin angular momentum to the conventional free layer 18'. As a result, a spin-polarized current can switch the magnetization 19' direction of the conventional free layer 18' if the current density is sufficiently high (approximately $10^7$–$10^8$ A/cm$^2$) and the lateral dimensions of the spin tunneling junction are small (approximately less than two hundred nanometers). In addition, for spin transfer to be able to switch the magnetization 19' direction of the conventional free layer 18', the conventional free layer 18' should be sufficiently thin, for instance, preferably less than approximately ten nanometers for Co. Spin transfer based switching of magnetization dominates over other switching mechanisms and becomes observable when the lateral dimensions of the conventional magnetic element 10/10' are small, in the range of few hundred nanometers. Consequently, spin transfer is suitable for higher density magnetic memories having smaller magnetic elements 10/10'.

The phenomenon of spin transfer can be used in the CPP configuration as an alternative to or in addition to using an external switching field to switch the direction of magnetization of the conventional free layer 18' of the conventional spin tunneling junction 10'. For example, the magnetization 19' of the conventional free layer 18' can be switched from antiparallel to the magnetization of the conventional pinned layer 14' to parallel to the magnetization of the conventional pinned layer 14'. Current is driven from the conventional free layer 18' to the conventional pinned layer 14' (conduction electrons traveling from the conventional pinned layer 14' to the conventional free layer 18'). The majority electrons traveling from the conventional pinned layer 14' have their spins polarized in the same direction as the magnetization of the conventional pinned layer 14'. These electrons may transfer a sufficient portion of their angular momentum to the conventional free layer 18' to switch the magnetization 19' of the conventional free layer 18' to be parallel to that of the conventional pinned layer 14'. Alternatively, the magnetization of the free layer 18' can be switched from a direction parallel to the magnetization of the conventional pinned layer 14' to antiparallel to the magnetization of the conventional pinned layer 14'. When current is driven from the conventional pinned layer 14' to the conventional free layer 18' (conduction electrons traveling in the opposite direction), majority electrons have their spins polarized in the direction of magnetization of the conventional free layer 18'. These majority electrons are transmitted by the conventional pinned layer 14'. The minority electrons are reflected from the conventional pinned layer 14', return to the conventional free layer 18' and may transfer a sufficient amount of their angular momentum to switch the magnetization 19' of the free layer 18' antiparallel to that of the conventional pinned layer 14'.

Although spin transfer functions, one of ordinary skill in the art will readily recognize that thermal stability of the magnetization 19 and 19' of the free layer 18 and 18', respectively, becomes an issue at smaller sizes of the conventional magnetic element 10 and 10', respectively (smaller bit sizes). The free layer 18 or 18' stores data. The directions of the magnetization 19 and 19' of the free layer 18 and 18', can typically assume either of the two directions along an easy axis (i.e. right or left as shown in FIGS. 1A and 1B). The thermal stability of the direction of magnetization depends on an energy barrier (E) between the two directions along the easy axis of magnetization. If the energy barrier is comparable to thermal energy fluctuations of the system, then the magnetization direction can be switched inadvertently. For the conventional free layers 18 and 18', the energy barrier, E, is given by $$E \propto H_k V/2$$

In the representation of E above, $H_k$ is the uni-axial anisotropy in the plane of the free layer 18 or 18' (the magnetic thin films used for the storage layer) and V is the volume of the free layer 18 or 18'. At smaller bit sizes (higher density storage), the volume of the free layer 18 or 18' and, therefore, the energy barrier decrease. Consequently, the direction of the magnetization 19 or 19' can more readily flip unintentionally, due to thermal fluctuations. Stated differently, the magnetizations 19 and 19' are less thermally stable for smaller sizes of the conventional magnetic elements 10 and 10', respectively, Accordingly, what is needed is a system and method for providing a magnetic memory element that can be switched using spin transfer and that has improved thermal stability during operation. The present invention addresses such a need.

SUMMARY OF THE INVENTION

The present invention provides a method and system for providing a magnetic element that can be used in a magnetic memory. In one aspect, the method and system comprise providing a pinned layer, providing a spacer layer, providing a free layer, and providing a heat assisted switching layer. The spacer layer is nonmagnetic and resides between the pinned layer and the free layer. The free layer resides between the spacer layer and the heat assisted switching layer. The heat assisted switching layer is for improving thermal stability of the free layer when the free layer is not being switched. This is achieved by increasing the effective uni-axial anisotropy of the free layer, for example due to the exchange coupling of the heat assisted switching layer and the free layer. In addition, the magnetic element is configured to allow the free layer to be switched due to spin transfer when a write current is passed through the magnetic element. In another aspect, the method and system comprise providing a second free layer, a second spacer layer, and a second pinned layer. The heat assisted switching layer resides between the first free layer and the second free layer. Furthermore, the first free layer and the second free layer are magnetostatically coupled. The second spacer layer is nonmagnetic and resides between the second free layer and the second pinned layer. The magnetic element is still configured to allow the free layer to be switched due to spin transfer when a write current is passed through the magnetic element.

According to the system and method disclosed herein, the present invention provides a magnetic element that is more thermally stable, and need not use a higher current to be written.

DETAILED DESCRIPTION OF THE INVENTION

Figure 1A:
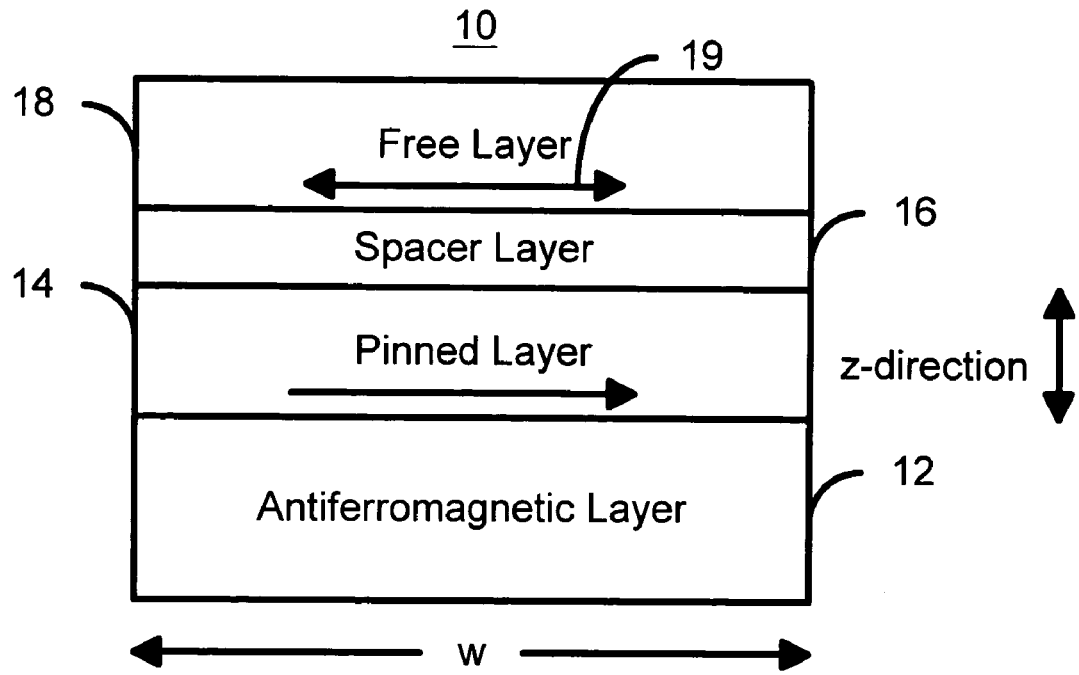
FIG. 1A is a diagram of a conventional magnetic element, a spin valve.
Figure 1B:
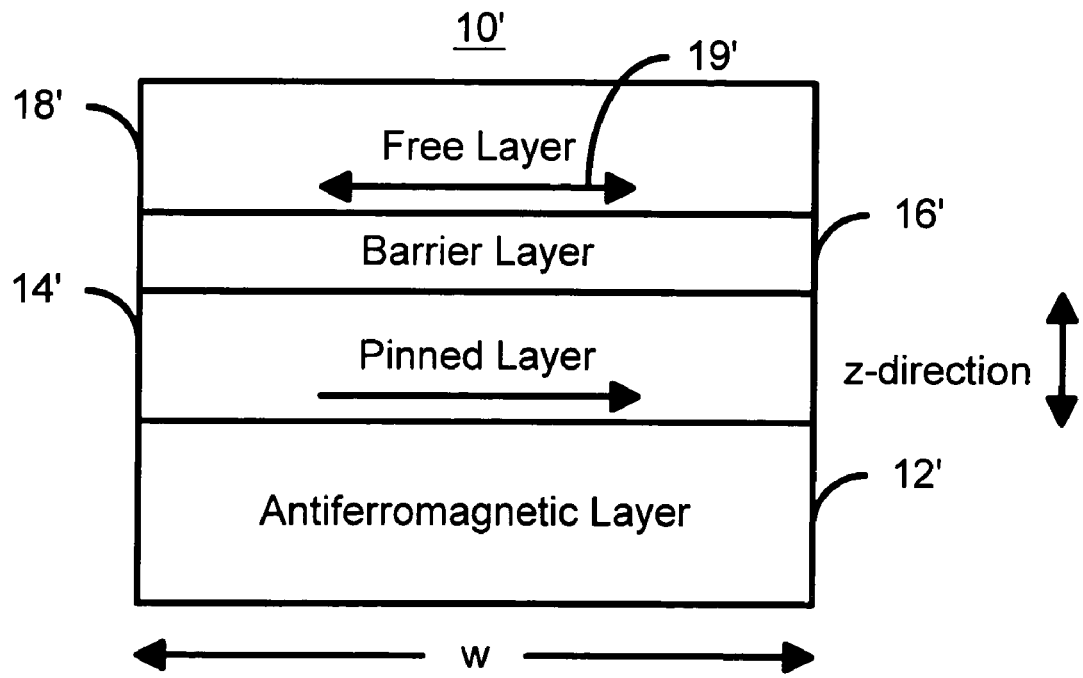
FIG. 1B is a diagram of another conventional magnetic element, a spin tunneling junction.

The present invention relates to an improvement in magnetic elements and magnetic memories, such as MRAM. The following description is presented to enable one of ordinary skill in the art to make and use the invention and is provided in the context of a patent application and its requirements. Various modifications to the preferred embodiments will be readily apparent to those skilled in the art and the generic principles herein may be applied to other embodiments. Thus, the present invention is not intended to be limited to the embodiments shown, but is to be accorded the widest scope consistent with the principles and features described herein.

The present invention provides a method and system for providing a magnetic element that can be used in a magnetic memory. In one aspect, the method and system comprise providing a pinned layer, providing a spacer layer, providing a free layer, and providing a heat assisted switching layer. The spacer layer is nonmagnetic and resides between the pinned layer and the free layer. The free layer resides between the spacer layer and the heat assisted switching layer. The heat assisted switching layer is for improving thermal stability of the free layer when the free layer is not being switched. In addition, the magnetic element is configured to allow the free layer to be switched due to spin transfer when a write current is passed through the magnetic element. In another aspect, the method and system comprise providing a second free layer, a second spacer layer, and a second pinned layer. The heat assisted switching layer resides between the first free layer and the second free layer. Furthermore, the first free layer and the second free layer are magnetostatically coupled. The second spacer layer is nonmagnetic and resides between the second free layer and the second pinned layer. The magnetic element is still configured to allow the free layer to be switched due to spin transfer when a write current is passed through the magnetic element.

The present invention will be described in terms of a particular magnetic memory and a particular magnetic element having certain components. However, one of ordinary skill in the art will readily recognize that this method and system will operate effectively for other magnetic memory elements having different and/or additional components and/or other magnetic memories having different and/or other features not inconsistent with the present invention. The present invention is also described in the context of current understanding of the spin transfer phenomenon. Consequently, one of ordinary skill in the art will readily recognize that theoretical explanations of the behavior of the method and system are made based upon this current understanding of spin transfer. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the present invention is described in the context of magnetic elements having particular layers. However, one of ordinary skill in the art will readily recognize that magnetic elements having additional and/or different layers not inconsistent with the present invention could also be used. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of single elements. However, one of ordinary skill in the art will readily recognize that the present invention is consistent with the use of magnetic memories having multiple elements, bit lines, and word lines.

Figure 2:
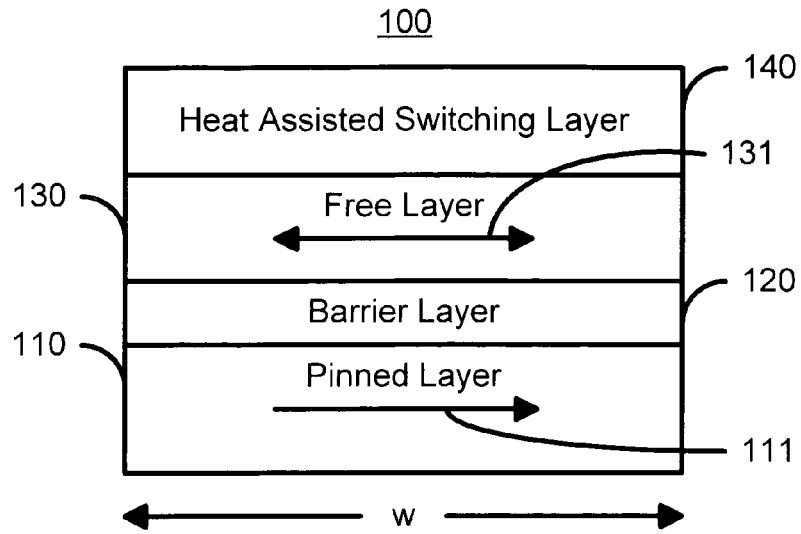
FIG. 2 depicts one embodiment of a portion of a magnetic element in accordance with the present invention utilizing heat assisted switching.

To more particularly illustrate the method and system in accordance with the present invention, refer now to FIG. 2, depicting one embodiment of a portion of the magnetic element 100 in accordance with the present invention utilizing heat assisted switching. The magnetic element 100 is preferably used in a magnetic memory, such as a MRAM. Thus, the magnetic element 100 may be used in a memory cell including an isolation transistor (not shown), as well as other configurations of magnetic memories. Moreover, the magnetic element 100 preferably utilizes two terminals (not shown) near the top and bottom of the magnetic element. The magnetic element 100 includes a pinned layer 110, a spacer layer 120, a free layer 130, and a heat assisted switching layer 140. The magnetic element 100 generally also includes an AFM layer (not shown) used to pin the magnetization 111 of the pinned layer 110, as well as seed layers (not shown) and capping layers (not shown). Furthermore, the magnetic element 100 is configured such that the free layer 130 can be written using spin transfer. In a preferred embodiment, the lateral dimensions, such as the width w, of the free layer 130 are thus small and preferably less than two hundred nanometers. In addition, some difference is preferably provided between the lateral dimensions to ensure that the free layer 130 has a particular easy axis.

The free layer 130 is ferromagnetic and preferably includes magnetic alloy containing at least one of elements Co, Fe or Ni. In a preferred embodiment, the ferromagnetic free layer 130 includes Co, CoFe, CoFeB or a bilayer (layers of the bilayer not separately depicted in FIG. 2) such as NiFe/CoFe. Furthermore, the free layer 130 may be a synthetic free layer. For example, such a synthetic free layer 130 may include a trilayer of Co/Ru/Co or CoFe/Ru/CoFe configured such that the magnetic layers are aligned antiparallel.

The pinned layer 110 is also ferromagnetic. In a preferred embodiment, described below, the pinned layer 110 is synthetic. In such an embodiment, the pinned layer 110 includes ferromagnetic layers separated by nonmagnetic layers and is configured such that the ferromagnetic layers are aligned antiparallel. The spacer layer 120 is nonmagnetic. In one embodiment, the spacer layer 120 may be conductive, for example including Cu. However, such an embodiment would have a lower resistance difference between the two different magnetization directions of the free layer. The magnetic element 100 would also have a lower overall resistance due to the use of a conductive spacer layer 120 in lieu of a higher resistance insulating barrier layer. For these reasons, such an embodiment would, have a lower signal. Consequently, the spacer layer 120 is preferably a tunneling barrier layer including an insulator such as alumina. In such an embodiment, the barrier layer 120 is less than two nanometers thick such that charge carriers can tunnel between the free layer 130 and the pinned layer 110.

The heat assisted switching layer 140 is configured such that the magnetization 131 of the free layer 130 is stabilized when the free layer 130 is not being switched. In a preferred embodiment, the heat assisted switching layer 140 is an antiferromagnetic layer that is exchange coupled to the free layer 130. In such an embodiment, the heat assisted switching layer 140 preferably has a low blocking temperature, of approximately one hundred and fifty degrees Celsius. The blocking temperature is the temperature at which the exchange coupling between the free layer and the antiferromagnetic heat assisted switching layer 140 reduces to zero. In a preferred embodiment, the heat assisted switching layer 140 is an antiferromagnetic $Ir_xMn_{1-x}$ layer, where x is between 0.2 to 0.8. Also in a preferred embodiment, the IrMn layer 140 has a composition close to $Ir_{20}Mn_{80}$ Preferably, the fabrication (composition, thickness, seed layer and deposition conditions) of the heat assisted switching layer 140 is tailored such that the IrMn has a blocking temperature on the order of one hundred and fifty degrees Celsius. The An AFM layer (not shown) pinning the pinned layer 110 is preferably PtMn with high blocking temperature (for example greater than two hundred degrees Celsius).

When the magnetic element 100 is quiescent (not being written to), the heat assisted switching layer 140 aids in stabilizing the magnetization 131 of the free layer 130 in the direction in which the free layer 130 was written. Thus, the thermal stability of the magnetic element 100 is improved. In the preferred embodiment, this stabilization is accomplished because the antiferromagnetic material is exchange coupled to the free layer 130. Although the ensuing discussion is for an antiferromagnetic layer used for the heat assisted switching layer 140, particularly one including IrMn, analogous principles hold for another layer which has an analogous effect. The effect of the exchange coupling between the heat assisted switching layer 140 and the free layer 130 is to increase the uniaxial anisotropy of the free layer 130. Hence the energy barrier between the two easy magnetization directions of the free layer 130 is increased significantly. The magnetization 131 of the free layer 130 is thus less likely to inadvertently switch directions, for example due to thermal fluctuations.

During writing, the magnetization 131 of the free layer 130 may be switched. During switching, the heat assisted switching layer 140 is heated to a desired temperature, resulting in a loss of exchange coupling. The heat assisted switching layer 140 thus no longer stabilizes the magnetization 131 of the free layer 130. In the preferred embodiment an antiferromagnetic layer, such as IrMn, is used for the heat assisted switching layer 140. IrMn is a preferred antiferromagnetic material because of its low blocking temperature. In such an embodiment, the magnetic element 100 is heated such that the heat assisted switching layer 140 is at least close to, and preferably above, the blocking temperature of the antiferromagnetic layer. Preferably, this heating is accomplished by resistive heating generated by the same current used to switch the magnetization of the free layer 130 through spin transfer. Because the heat assisted switching layer 140 is preferably at or above the blocking temperature of the antiferromagnetic material used, the exchange coupling between the heat assisted switching layer 140 and the free layer 130 goes to zero. Thus, the magnetization of the free layer 130 may be switched using a current that is substantially the same as in the absence of the heat assisted switching layer 140. When the write current is turned off, preferably in stages, the heat assisted switching layer 140 cools and has an alignment based upon the magnetization 131 of the free layer 130. The heat assisted switching layer 140 can thus stabilize the magnetization 131 of the free layer 130 in the new direction.

During reading, a read current is driven through the magnetic element 100 in the CPP configuration. The read current is preferably significantly less than the write current. As a result, the read current is not sufficient to induce a spin transfer based switching of the magnetization 131 of the free layer 130, will not heat the heat assisted switching layer 140 sufficiently to break the coupling with the free layer 130, and will not inadvertently switch the magnetization of the free layer 130.

More specifically, assume that the heat assisted switching layer 140 is an IrMn layer configured to have a blocking temperature of one hundred fifty degrees Celsius. The critical switching current density, $J_c$, for spin transfer driven magnetization switching can be given as:

$$J_c \propto \alpha M_s t (H_{\mathit{eff}/} + 2\pi M)$$

where $H_{\mathit{eff}/}$ includes anisotropy field ($H_{an}$), exchange ($H_{ex}$) and applied field ($H_{ap}$) aligned along the easy axis of free layer in the film plane. The $4\pi M$ term corresponds to the demagnetizing field, acting perpendicular to the free layer plane. If the magnetic element (including an IrMn heat assisted switching layer 140) is heated to a temperature above the blocking temperature (one hundred and fifty degrees Celcius in this case), the magnetization can be switched at lower spin transfer current value since $H_{ex}$ would be negligible at this temperature.

As discussed above, in order to heat the heat assisted switching layer 140 to the desired temperature, resistive heating can be used. The heat generated by resistive heating in the heat assisted switching layer 140 can be estimated assuming a two nanosecond pulse of five hundred millivolts and one milliamp. The resistive heating for configuration such as the magnetic element 100 is then given by:

Heat generated=$V*I*$time=500 mV*1 mA*2 nsec=1×$10^{-12}$ J

Effective specific heat of element, including $Ir_{20}Mn_{80}$~0.45 J/g.K

Volume of stack=0.03 μm*0.2 μm*0.21 μm=1.2×$10^{-15}$ cm$^3$

Effective density of top part of stack~9 g/cm$^3$

Temperature Rise=[1×$10^{-12}$]/[(0.45)*(1.2×$10^{-15}$)*(9)] ~200 K

Thus a temperature rise of two hundred Kelvin, or two hundred degrees Celsius, can be achieved. Note that this calculation assumes very good thermal insulation around (sides of) the magnetic element 100. The good thermal insulation may be achieved using standard dielectric materials and by encapsulating (top and bottom) the magnetic element 100 between metal films having relatively poor thermal conductivity. Resistive heating of an adjacent word line (not shown) could also provide heating of the heat assisted switching layer 140. Thus, the magnetic element 100 may be switched using spin transfer without increasing the current used when the magnetic element 100 undergoes resistive heating. The magnetization 131 of the free layer 130 is also stabilized when the magnetic element is not being written to. Furthermore, when the spacer layer 120 is a barrier layer, the resistance and thus the signal for the magnetic element 100 is increased. Consequently, the magnetic element 100 is more thermally stable when it is not being written to, can still be written using spin transfer at a relatively small write current, and still have an improved signal.

Figure 3A:
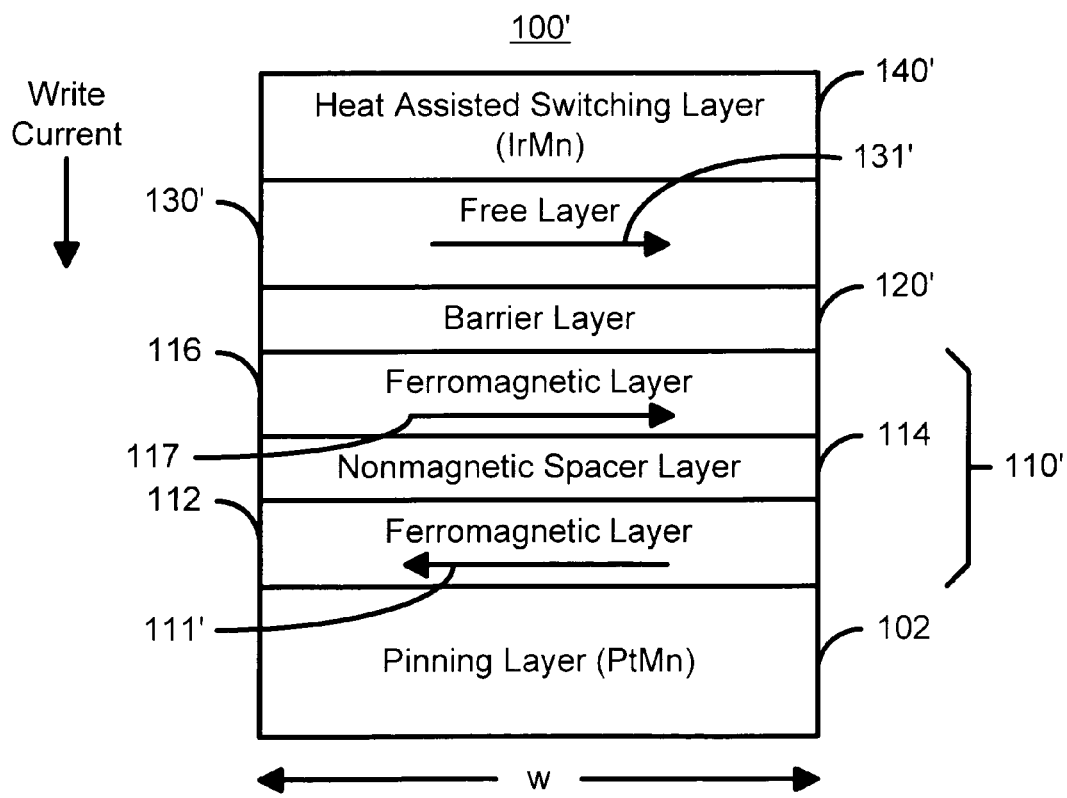
FIG. 3A is a second embodiment of a magnetic element in accordance with the present invention utilizing heat assisted switching with a current applied to switch the free layer magnetization.
Figure 3B:
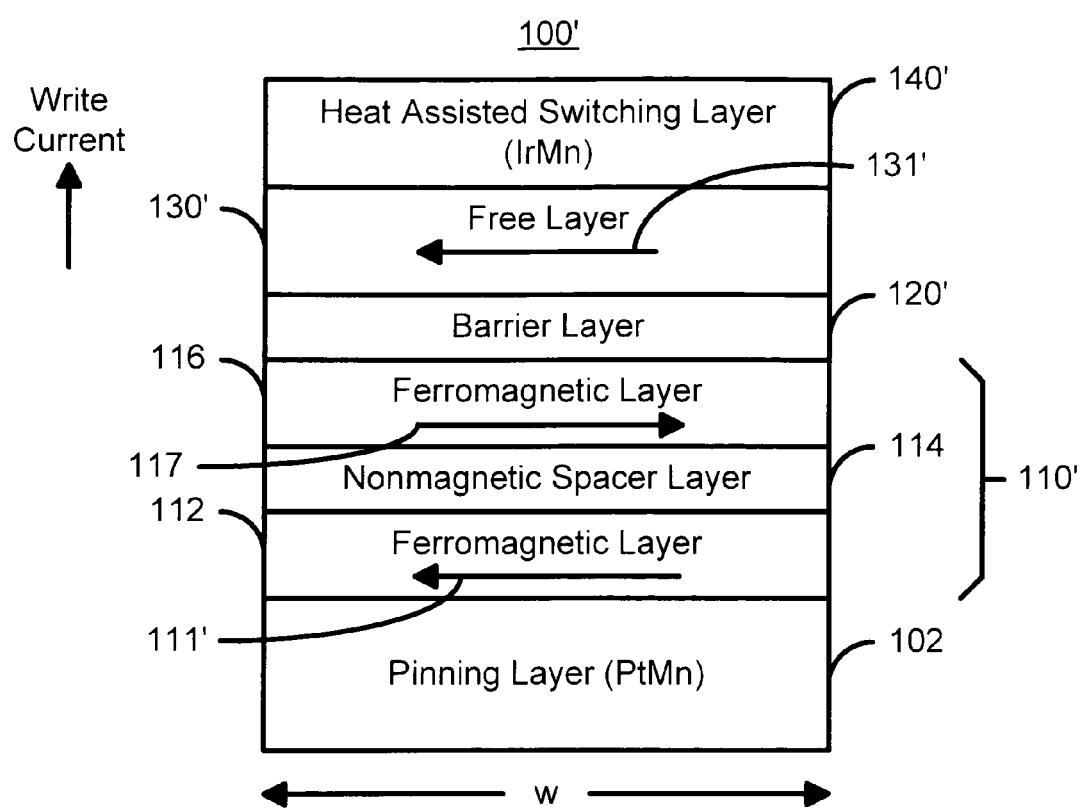
FIG. 3B is the second embodiment of a magnetic element in accordance with the present invention utilizing heat assisted switching with a current applied to switch the free layer to have its magnetization antiparallel to the pinned layer.

FIGS. 3A and 3B depict a second embodiment of a magnetic element in accordance with the present invention utilizing heat assisted switching. In FIGS. 3A and 3B, the magnetic element 100' is depicted with a current applied to switch the free layer 130' to have its magnetization parallel and antiparallel, respectively, to the pinned layer 140'. Portions of the magnetic element 100' are analogous to portions of the magnetic element 100 and are, therefore, labeled similarly. Consequently, the magnetic element 100' includes a pinned layer 110', a spacer layer 120', a free layer 130', and a heat assisted switching layer 140'. The magnetic element 100' also includes a pinning layer 102 that is used to pin the magnetization 111' of the pinned layer 110' in the desired direction. In addition, the magnetic element 100' generally also includes seed layers (not shown) and capping layers (not shown). Furthermore, the magnetic element 100' is configured such that the free layer 130' can be written using spin transfer. In a preferred embodiment, the lateral dimensions, such as the width w, of the free layer 130' are thus small and preferably less than two hundred nanometers. In addition, some difference is preferably provided between the lateral dimensions to ensure that the free layer 130' has a particular easy axis of magnetization.

The free layer 130' is ferromagnetic and preferably includes magnetic alloy containing at least one of elements Co, Fe or Ni. In a preferred embodiment, the free layer 130' includes Co, CoFe, CoFeB or a bilayer (layers of the bilayer not separately depicted in FIGS. 3A and 3B) such as NiFe/CoFe. Furthermore, the free layer 130' may be a synthetic free layer. For example, such a synthetic free layer 130' may include a trilayer of Co/Ru/Co or CoFe/Ru/CoFe configured such that the magnetic layers are aligned antiparallel. However, in an alternate embodiment, other analogous structures can be used.

The pinned layer 110' is synthetic. The pinned layer 110' thus includes ferromagnetic layers 112 and 116 separated by a nonmagnetic spacer layer 114. The nonmagnetic spacer promotes antiparallel coupling of the ferromagnetic layers. The nonmagnetic spacer layer 114 is preferably Ru. In a preferred embodiment, the ferromagnetic layers 112 and 116 include Co, CoFe, or CoFeB. The pinned layer 110' is also configured such that the magnetizations of the ferromagnetic layers 112 and 116 are aligned antiparallel.

The pinning layer 102 is preferably an antiferromagnetic layer having a high blocking temperature. In a preferred embodiment, the pinning layer 102 includes PtMn and is fabricated to have a blocking temperature in excess of two hundred degrees Celsius.

In a preferred embodiment, described below, the pinned layer 110' is synthetic. In such an embodiment, the pinned layer 110' includes ferromagnetic layers separated by nonmagnetic layers and is configured such that the ferromagnetic layers are aligned antiparallel. The spacer layer 120' is nonmagnetic. In one embodiment, the spacer layer 120' may be conductive, for example including Cu. However, such an embodiment would have a lower resistance and, therefore, a lower signal. Consequently, the spacer layer 120' is preferably a barrier layer including an insulator such as alumina. In such an embodiment, the barrier layer 120' is less than two nanometers thick such that charge carriers can tunnel between the free layer 130' and the pinned layer 110'.

The heat assisted switching layer 140' is configured such that the magnetization 131' of the free layer 130' is stabilized when the free layer 130' is not being switched. In a preferred embodiment, the heat assisted switching layer 140' is an antiferromagnetic layer that is exchange coupled to the free layer 130'. In such an embodiment, the heat assisted switching layer 140' preferably has a low blocking temperature, less than two hundred degrees Celsius, and preferably on the order of one hundred and fifty degrees Celsius. In a preferred embodiment, the heat assisted switching layer 140' is an antiferromagnetic $Ir_xMn_{1-x}$ layer, where x is between 0.2 and 0.8. Also in a preferred embodiment, the IrMn layer 140' has a composition close to $Ir_{20}Mn_{80}$. Preferably, the fabrication (composition, thickness, seed layer and deposition conditions) of the heat assisted switching layer 140' is tailored such that the IrMn has a blocking temperature on the order of one hundred and fifty degrees Celsius.

The heat assisted switching layer 140' acts in substantially the same manner as the heat assisted switching layer 140 depicted in FIG. 2 and described above. Referring back to FIGS. 3A and 3B, the heat assisted switching layer 140' aids in stabilizing the magnetization 131' of the free layer 130' in the direction in which the free layer 130' was written when the free layer 130' is being not switched. Thus, the thermal stability of the magnetic element 100' is improved. However, during switching of the magnetization 131' of the free layer 130', the heat assisted switching layer 140' is heated to a temperature at which the heat assisted switching layer 140' no longer stabilizes the magnetization 131' of the free layer 130'. Stated differently, the magnetic element 100' is preferably heated to or above the blocking temperature of the heat assisted switching layer 140' to reduce the exchange coupling between the heat assisted switching layer 140' and the free layer 130' to zero. Moreover, in a preferred embodiment, the blocking temperature of the IrMn heat assisted switching layer 140' is significantly less than the blocking temperature of the PtMn pinning layer 102. As a result, the coupling between the ferromagnetic layer 112 of the pinned layer 110' and the pinning layer 102 is not substantially reduced during switching of the magnetization 131' of the free layer 130'. Consequently, the magnetic element 100' is more thermally stable when it is not being written to, but can still be relatively easily written using spin transfer.

For example, FIG. 3A depicts the magnetic element 100' when the magnetization 131' of the free layer 130' is switched to be parallel to the ferromagnetic layer 116. Current is driven in the downward direction as depicted in FIG. 3A. Consequently, electrons flow from the ferromagnetic layer 116 to the free layer 130'. The majority electrons are spin polarized in the direction of the magnetization 117 of the pinned layer 116. These majority electrons may transfer sufficient angular momentum to the free layer 130' to flip the magnetization 131' of the free layer 130' to be parallel to the magnetization 117 of the pinned layer 116. Thus, the magnetization 131' of the free layer 130' is switched to (or remains in if the magnetizations 131' and 117 had previously been parallel) be parallel to the magnetization 117.

Alternatively, FIG. 3B depicts the magnetic element 100' when the magnetization 131' of the free layer 130' is switched to be antiparallel to the ferromagnetic layer 116. Current is driven upward as depicted in FIG. 3B. Thus, electrons travel from the free layer 130' to the ferromagnetic layer 116. If the magnetization 131' of the free layer 130' had previously been aligned parallel to the magnetization 117 of the ferromagnetic layer, the majority electrons are transmitted by the ferromagnetic layer 116. However, minority electrons (having their spins aligned antiparallel to the magnetizations of the free layer 130' and the ferromagnetic layer 116) are reflected. These reflected electrons may transfer sufficient angular momentum to switch the magnetization of the free layer 131' to be antiparallel to the magnetization 117 of the ferromagnetic layer 116, as shown in FIG. 3B. Thus, the magnetization 131' of the free layer 130' is switched to (or remains in if the magnetizations 131' and 117 had previously been antiparallel) be antiparallel to the magnetization 117.

Figure 4A:
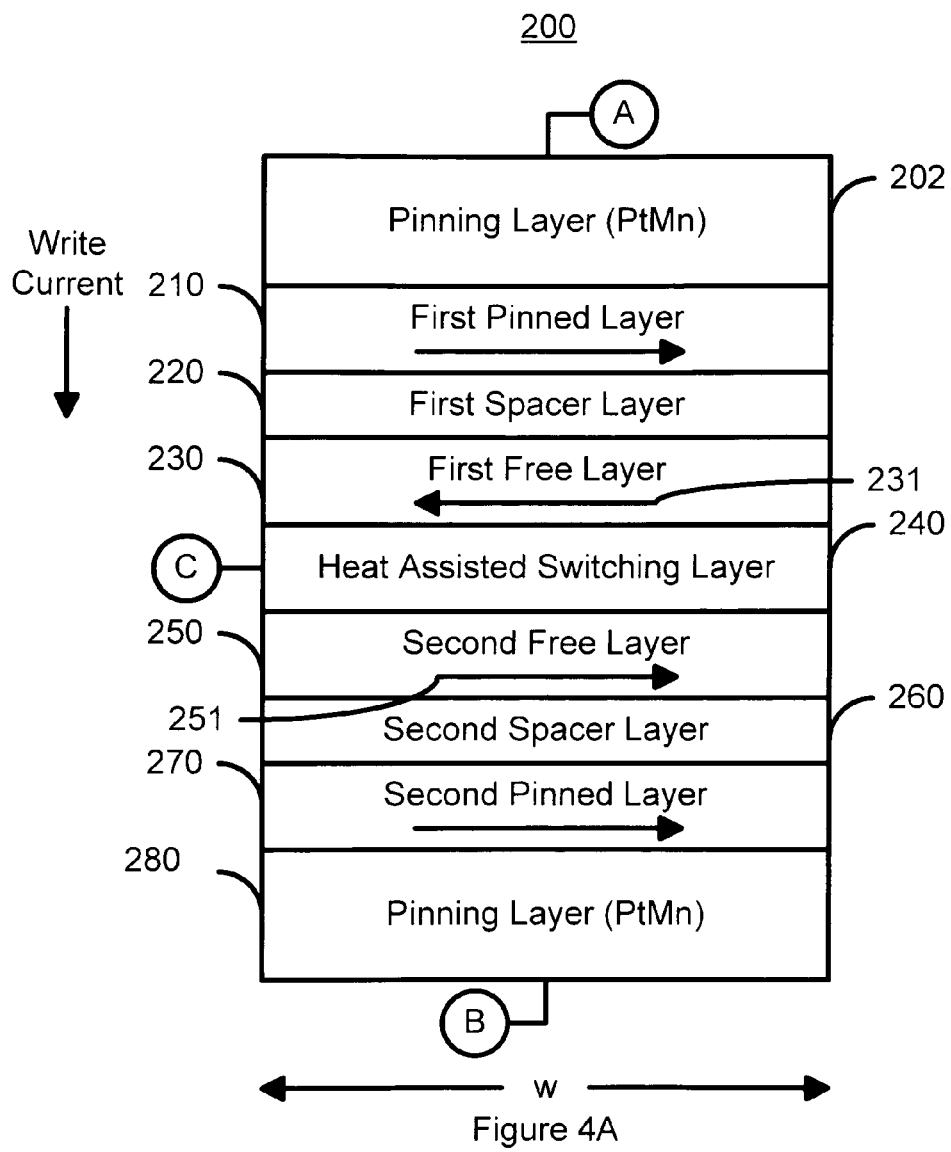
FIG. 4A depicts a third, preferred embodiment of a portion of a magnetic element in accordance with the present invention utilizing heat assisted switching.
Figure 4B:
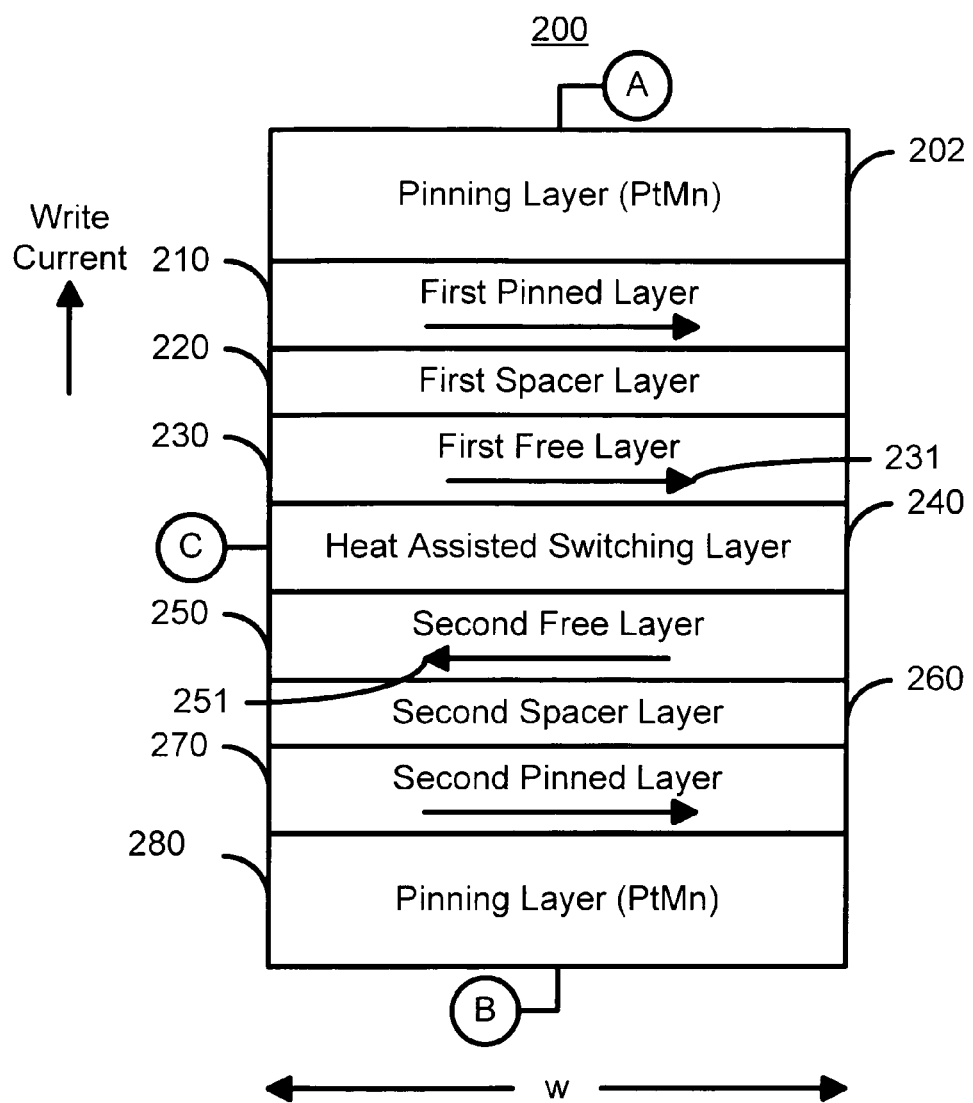
FIG. 4B depicts a third, preferred embodiment of a portion of a magnetic element in accordance with the present invention utilizing heat assisted switching.

FIGS. 4A and 4B depict a third, preferred embodiment of a portion of a magnetic element 200 in accordance with the present invention utilizing heat assisted switching. Note that three terminals A, B, and C are depicted as being coupled with the magnetic element 200. However, nothing prevents the use of another number of terminals, such as two terminals. For the two terminal version, the terminal C would be removed. The magnetic element 200 includes a first pinning layer 202, a first pinned layer 210, a first spacer layer 220, a first free layer 230, a heat assisted switching layer 240, a second free layer 250, a second spacer layer 260, a second pinned layer 270, and a second pinning layer 280. Thus, the magnetic element 200 can be considered to include two structures, each of which is analogous to the magnetic element 100, but which share the heat assisted switching layer 240. The first free layer 230 and the second free layer 250 are magnetostatically coupled, preferably so that the magnetization 231 of the first free layer 230 is antiparallel to the magnetization 251 of the second free layer 250. The magnetic element 200 is also configured such that at least the first free layer 230 can be switched using spin transfer. In a preferred embodiment, the lateral dimensions, such as the width w, of the first free layer 230 are thus small and preferably less than two hundred nanometers. In addition, some difference is preferably provided between the lateral dimensions to ensure that the first free layer 230 has a particular easy axis.

The free layers 230 and 250 are ferromagnetic and preferably include magnetic alloy containing at least one of elements Co, Fe or Ni. In a preferred embodiment, each of the first free layer 230 and the second free layer 250 includes Co, CoFe, CoFeB or a bilayer (layers of the bilayer not separately depicted in FIGS. 3A and 3B) such as NiFe/CoFe. Furthermore, the free layer 230 and/or the free layer 250 may be synthetic. For example, such a synthetic free layer 230 and/or 250 may include a trilayer of Co/Ru/Co or CoFe/Ru/CoFe configured such that the magnetic layers are aligned antiparallel. However, in an alternate embodiment, other analogous structures can be used. Also in a preferred embodiment, the free layers 230 and 250 are magnetostatically coupled to have their magnetizations 231 and 251, respectively, antiparallel. Also in a preferred embodiment, the free layers 230 and 250 as well as the heat assisted switching layer 240 are configured to optimize this magnetostatic coupling.

The pinned layers 210 and 270 are preferably synthetic. The pinned layers thus preferably include ferromagnetic layers (not shown) separated by a nonmagnetic spacer layer (not shown) which promotes anti-ferromagnetic coupling of the ferromagnetic layers. The pinned layers 210 and 270 are preferably magnetic alloys containing at least one of elements Co, Fe or Ni. In a preferred embodiment, the composition of each of the pinned layers 210 and 270 contains Co, CoFe, or CoFeB.

The pinning layers 202 and 280 are preferably antiferromagnetic layers 202 and 280. The antiferromagnetic layers 202 and 280 are preferably PtMn or PtMnCr. Blocking temperatures of the pinning layers 202 and 280 are preferably greater than 200 C.

The spacer layers 220 and 260 are nonmagnetic. The spacer layers 220 and 260 could be conductive, insulating tunneling barrier layers, and/or insulating layers having ferromagnetic conductive channels. The spacer layers 220 and 260 also preferably have different properties. In a preferred embodiment, the first spacer layer 220 is conductive, for example including Cu. Thus, in a preferred embodiment, the first pinned layer 210, the first spacer layer 220 and the first free layer 230 function as a spin valve. Also in a preferred embodiment, the second spacer layer 260 is insulating or is otherwise configured to have a higher resistance when a read current is passed through the magnetic element 200. In one embodiment, the second spacer layer 260 is a tunneling barrier layer including an insulator such as alumina. In such an embodiment, the barrier layer 260 is less than two nanometers thick such that charge carriers can tunnel between the second free layer 250 and the second pinned layer 270. In this embodiment, the lower portion of the magnetic element 200 including the second free layer 250, the second spacer layer 260, and the second pinned layer 270 function as a spin tunneling junction. In another embodiment, the second spacer layer 260 is a ballistic magnetoresistance (BMR) spacer. The BMR spacer 260 is preferably used only when three terminals A, B, and C are used. In addition, the BMR spacer generally precludes the second free layer 250 from being switched using spin transfer due to electrons from or reflected by the pinned layer 270. In such an embodiment, the BMR spacer 260 includes ferromagnetic alloy containing at least one of the elements Co, Fe or Ni embedded in an insulating matrix of $SiO_2$ or SiC, such that the ferromagnetic material forms at least one channel (not explicitly shown) extending through the length (from top to bottom as shown in FIG. 4) of the second spacer layer 260. The channel width is preferably between one and three nanometers and of such a length (same as thickness of the spacer) so as to allow ballistic transport of electrons. The channel also serves as site for location of sharp domain wall, when the magnetization directions of the layer at its two ends are anti-parallel. In this embodiment, the second spacer 260 is optimized to obtain high ballistic magneto-resistance.

The heat assisted switching layer 240 is configured such that the magnetization 231/251 of the free layers 230/250 respectively, is stabilized when the free layers 230/250 is not being switched. In a preferred embodiment, the heat assisted switching layer 240 is an antiferromagnetic layer that is exchange coupled to the free layers 230/250. In such an embodiment, the heat assisted switching layer 240 preferably has a low blocking temperature, on the order of two hundred degrees Celsius or less and is preferably approximately one hundred and fifty degrees Celsius. As a result, the exchange coupling between the heat assisted switching layer 240 and the free layers 230/250 can be driven to zero at a relatively low temperature. In a preferred embodiment, the heat assisted switching layer 240 is an antiferromagnetic $Ir_xMn_{1-x}$ layer, where x is between 0.2 and 0.8. Also in a preferred embodiment, the IrMn layer 240 has a composition close to $Ir_{20}Mn_{80}$. Preferably, the fabrication (composition, thickness, seed-layer and deposition conditions) of the heat assisted switching layer 240 is tailored such that the IrMn has a blocking temperature on the order of one hundred and fifty degrees Celsius. Thus, the blocking temperature of the heat assisted switching layer 240 is preferably less than the blocking temperature of the pinning layers 202 and 280. Furthermore, the heat assisted switching layer 240 is configured such that the free layers 230 and 250 are magnetostatically coupled. The thickness of the heat assisted switching layer 240 is preferably configured to provide a significant, antiparallel coupling between the first free layer 230 and the second free layer 250. The thickness of the heat assisted switching layer 240 is preferably between five nanometers and fifteen nanometers, and in no case less than two nanometers.

In a preferred embodiment, in the three terminal configuration of the magnetic element 200, a write current is provided between terminals A and C, while a read current is provided between terminals C and B. In the two terminal configuration, both the write and read currents are provided between terminals A and B.

When the magnetic element 200 is not being written to, the heat assisted switching layer 240 aids in stabilizing the magnetization 231 of the first free layer 230 in the direction in which the first free layer 230 was written. Because the free layers 230 and 250 are strongly magnetostatically coupled, the magnetization 251 of the second free layer 250 is also stabilized in an antiparallel configuration (magnetization 251 antiparallel to the magnetization 231). Thus, the thermal stability of the magnetic element 200 is improved. In the preferred embodiment, this stabilization is accomplished because the antiferromagnetic material in the heat assisted switching layer 240 is exchange coupled to the free layer 230 and 250.

During writing, the magnetization 231/250 of the free layers 230/250 may be switched. The desired configuration is that in which the free layer 130 switches primarily by spin transfer. During switching, the heat assisted switching layer 240 is heated to a desired temperature and thus no longer stabilizes the magnetization 231 of the free layer 230. In the preferred embodiment an antiferromagnetic layer, such as IrMn, is used for the heat assisted switching layer 240. IrMn is a preferred antiferromagnetic material because of its low blocking temperature. The magnetic element 200 is heated such that the heat assisted switching layer 240 is at least close to, and preferably above, the blocking temperature of the antiferromagnetic layer, thereby driving the exchange coupling with the free layers 230 and 250 to zero. Preferably, this heating is accomplished by resistive heating generated by the same current used to switch the magnetization of the free layer 230 through spin transfer. Such resistive heating is described above with respect to the magnetic element 100 depicted in FIG. 2. Referring back to FIG. 4, because the heat assisted switching layer 240 is preferably at or above the blocking temperature of the antiferromagnetic material used for the heat assisted switching layer 240, the exchange coupling between the heat assisted switching layer 240 and the free layers 230 and 250 may be broken. Thus, the magnetization 231 of the free layer 230 may be switched using a current that is substantially the same as in the absence of the heat assisted switching layer 240. Furthermore, because of the magnetostatic coupling between the free layers 230 and 250, a change in the direction of magnetization of the free layer 230 causes a change in the direction of magnetization of the second free layer 250. Thus, the magnetization 251 of the free layer 250 can also change direction. In addition, because of the use of the low blocking temperature IrMn, the temperature to which the magnetic element 200 is heated is below the blocking temperature of the pinning layers 202 and 280. The pinned layers 210 and 270 are, therefore, substantially unaffected by the heating during switching. When the write current is turned off, the heat assisted switching layer 240 cools and the magnetizations 231/251 of the free layers 230/250 are maintained. The heat assisted switching layer 240 can then stabilize the magnetization 231 of the free layer 230 in the new direction. Because of the magnetostatic coupling between the free layers 230 and 250, the magnetization 251 of the free layer 250 is also stabilized. Furthermore, when the three terminal configuration is used for the magnetic element 200, the write current is driven between terminals A and C. Consequently, the second spacer 260, which preferably includes an insulator, is not exposed to the higher write current. Thus, in the three terminal configuration, the magnetic element 200 is less likely to be damaged.

During reading, a read current is driven through the magnetic element 200. In a preferred, three terminal configuration, this read current is driven only between terminals B and C. In both configurations, the read current is preferably significantly less than the write current. In both embodiments, the read current is low enough that it does not heat the heat assisted switching layer 240 sufficiently to break the coupling with the free layer 230 and will not inadvertently switch the magnetization of the free layer 230. Furthermore, when the spacer layer 220 is a barrier layer, the resistance and thus the signal for the magnetic element 200 is increased. Consequently, the magnetic element 200 is more thermally stable when it is not being written to, can still be written using spin transfer at a relatively small write current, and still have an improved signal.

Figure 5A:
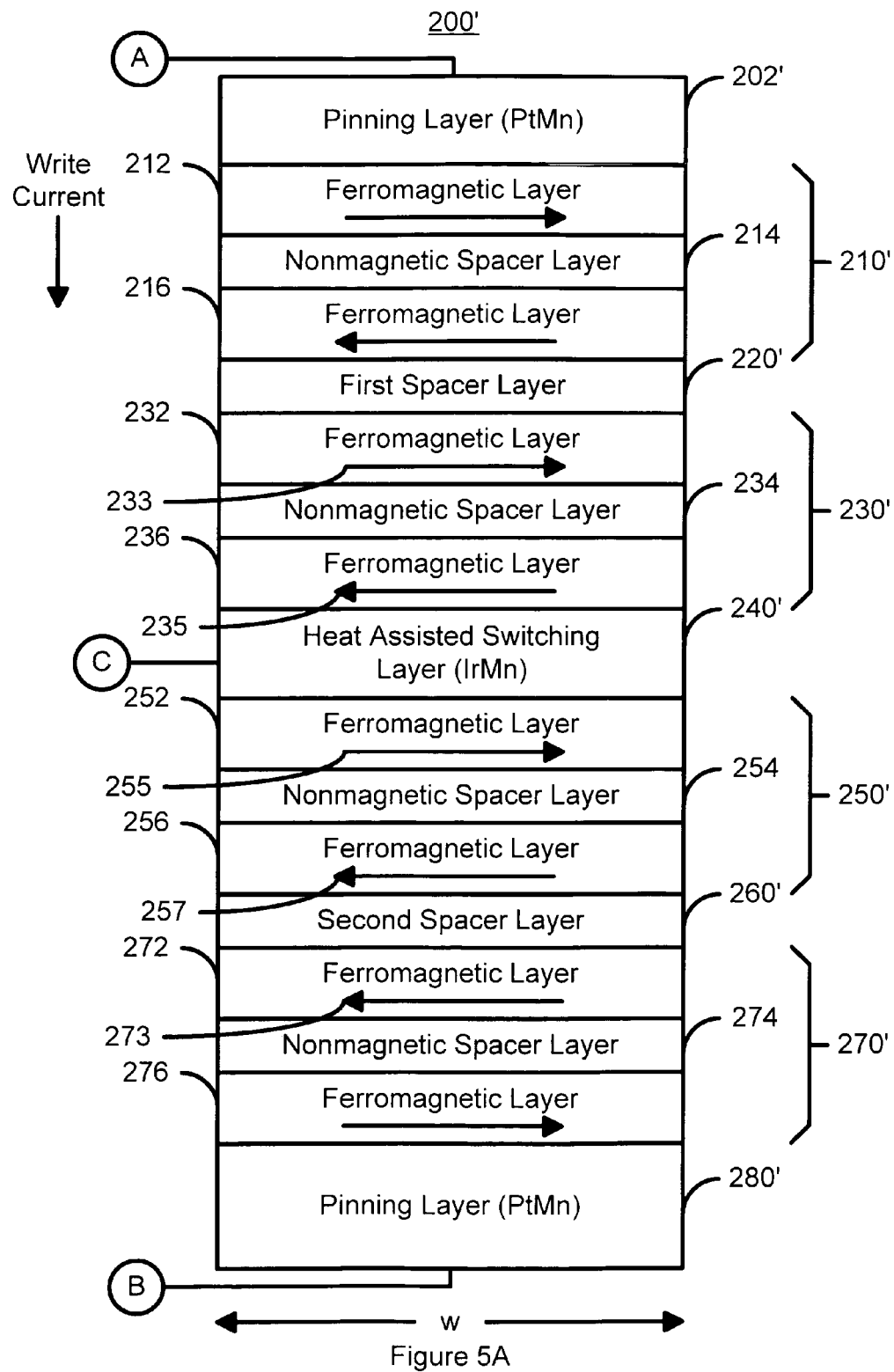
FIG. 5A is a fourth embodiment of a magnetic element in accordance with the present invention utilizing heat assisted switching with a current applied to switch the free layer to have its magnetization parallel to the pinned layer.
Figure 5B:
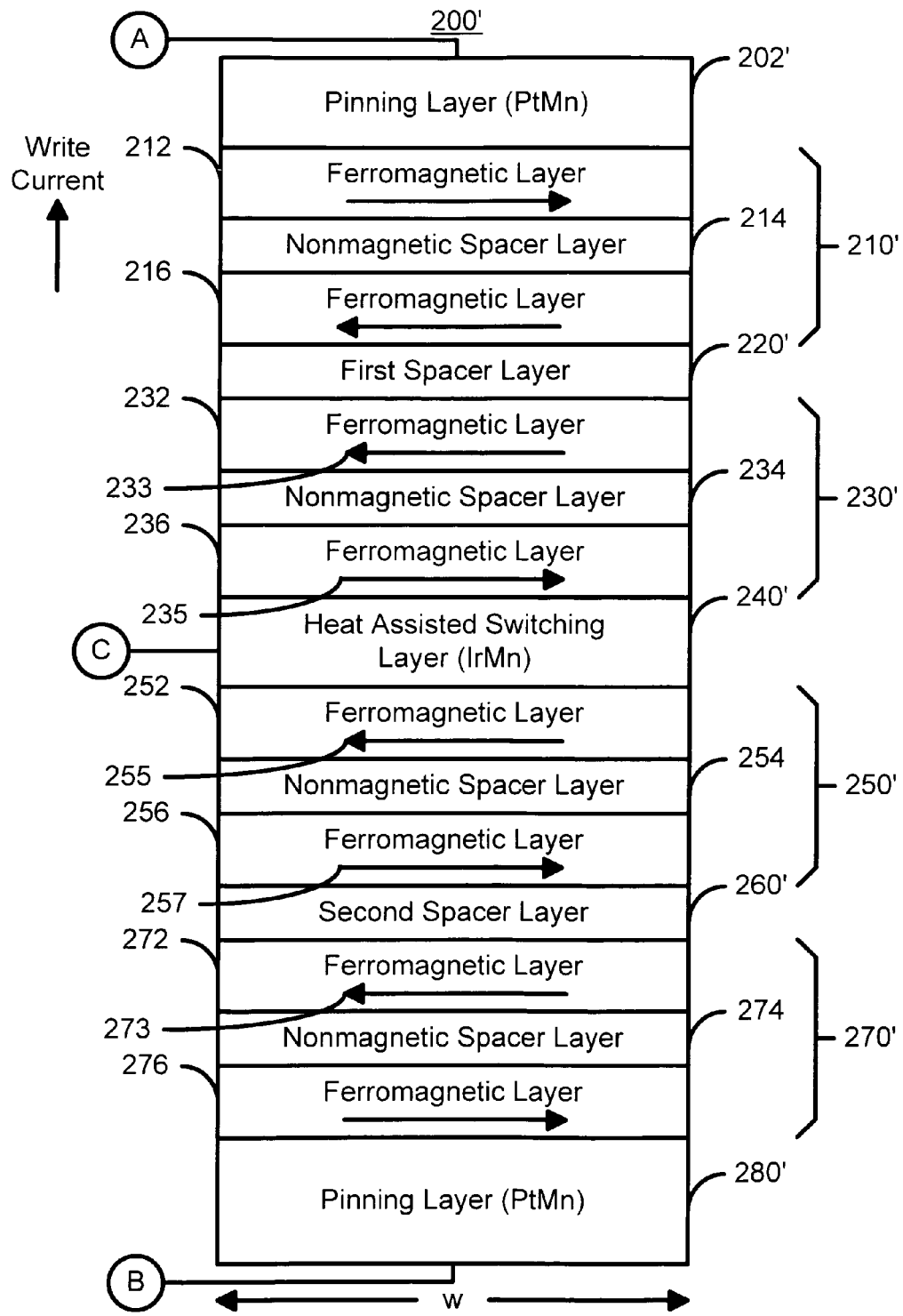
FIG. 5B is the fourth embodiment of a magnetic element in accordance with the present invention utilizing heat assisted switching with a current applied to switch the free layer to have its magnetization antiparallel to the pinned layer.

FIGS. 5A and 5B depict a fourth embodiment of a magnetic element 200' in accordance with the present invention utilizing heat assisted switching with a current applied to switch the free layer to have its magnetization parallel and antiparallel to the magnetization of the portion of the pinned layer closest to the free layer. Portions of the magnetic element 200' are analogous to the magnetic element 200 and are thus labeled similarly. Note that three terminals A, B, and C are depicted as being coupled with the magnetic element 200'. However, nothing prevents the use of another number of terminals, such as two terminals. For the two terminal version, the terminal C would be removed. The magnetic element 200' includes a first pinning layer 202', a first pinned layer 210', a first spacer layer 220', a first free layer 230', a heat assisted switching layer 240', a second free layer 250', a second spacer layer 260', a second pinned layer 270', and a second pinning layer 280'. The magnetic element 200' is also configured such that at least the first free layer 230' can be switched using spin transfer. Thus, the magnetic element 200' can be considered to include two structures, each of which is analogous to the magnetic element 100, but which share the heat assisted switching layer 240'. In a preferred embodiment, the lateral dimensions, such as the width w, of the first free layer 230' are thus small and preferably less than two hundred nanometers. In addition, some difference is preferably provided between the lateral dimensions to ensure that the first free layer 230' has a particular easy axis.

The free layers 230' and 250' as well as the pinned layers 210' and 270' are preferably synthetic. Consequently, the first pinned layer 210' includes ferromagnetic layers 212 and 216 that are antiferromagnetically aligned and separated by a nonmagnetic spacer layer 214 that is preferably Ru. The second pinned layer 270' includes ferromagnetic layers 272 and 276 that are antiferromagnetically aligned and separated by a nonmagnetic spacer layer 274 that is preferably Ru. The first free layer 230' includes ferromagnetic layers 232 and 236 that are antiferromagnetically aligned and separated by a nonmagnetic spacer layer 234 that is preferably Ru. The second free layer 250' includes ferromagnetic layers 252 and 256 that are antiferromagnetically aligned and separated by a nonmagnetic spacer layer 254 that is preferably Ru. The ferromagnetic layers 232 and 236 and 252 and 256 of the free layers 230 and 250, respectively, are preferably magnetic alloys containing at least one of elements Co, Fe or Ni. Preferably, the ferromagnetic layers 232, 236, 252, and 256 are Co, CoFe, CoFeB or a bilayer such as NiFe/CoFe.

The first free layer 230' and the second free layer 250' are magnetostatically coupled. More specifically, the ferromagnetic layer 236 is magnetostatically coupled to the ferromagnetic layer 252. Thus, the magnetization 235 of the ferromagnetic layer 236 is preferably antiparallel to the magnetization 255 of the ferromagnetic layer 252. The saturation magnetization of the ferromagnetic layer 236 and the ferromagnetic layer 252 are also significantly higher than the saturation magnetization of either the ferromagnetic layer 232 or the ferromagnetic layer 256. Consequently, the magnetostatic coupling between the ferromagnetic layers 252 and 236 is optimized across the IrMn layer.

The pinned layers 210' and 270' are synthetic. The pinned layer 210' thus includes ferromagnetic layers 212 and 216 that are antiferromagnetically aligned and separated by a nonmagnetic spacer layer 214 that is preferably Ru. Similarly, the pinned layer 270' includes ferromagnetic layers 272 and 276 that are antiferromagnetically aligned and separated by a nonmagnetic spacer layer 274 that is preferably Ru. The ferromagnetic layers 212, 216, 272, and 276 are preferably magnetic alloys containing at least one of elements Co, Fe or Ni. In a preferred embodiment, the ferromagnetic layers 212, 216, 272, and 276 include Co, CoFe, or CoFeB. The thicknesses of ferromagnetic layers 212 and 216 and 272 and 276 of the pinned layers 210' and 270', respectively, are such that the net magnetization of the pinned layer 210' and the net magnetization of the pinned layer 270' are close to zero.

The pinning layers 202' and 280' are preferably antiferromagnetic. The antiferromagnetic layers 202' and 280' are preferably PtMn or PtMnCr. Blocking temperatures of the pinning layers 202' and 280' are preferably significantly greater than 200 C.

The spacer layers 220' and 260' are nonmagnetic. Although in alternate embodiments, the spacer layers 220' and 260' can have other properties, in a preferred embodiment, the first spacer layer 220' is conductive, for example including Cu. Also in a preferred embodiment, the second spacer layer 260' is an insulator, preferably an insulating tunneling barrier layer. The second spacer layer 260' could also be an insulating layer having ferromagnetic conductive channels. The spacer layers 220 and 260, therefore, preferably have different properties. Thus, the first pinned layer 210', the first spacer layer 220', and the first free layer 230' preferably function as a spin valve. In the preferred embodiment, the second spacer layer 260' is a barrier layer including an insulator such as alumina. In such an embodiment, the barrier layer 260' is less than two nanometers thick such that charge carriers can tunnel between the second free layer 250' and the second pinned layer 270'. The second free layer 250', the second spacer layer 260' and the second pinned layer 270' would thus function as a spin tunneling junction. In an alternate embodiment, the second spacer layer 260' is a BMR spacer. The BMR spacer 260' is preferably used only when three terminals A, B, and C are used. In addition, the use of a BMR spacer 260' generally precludes the second free layer 250' from being switched using spin transfer due to electrons from or reflected by the pinned layer 270'. In such an embodiment, the BMR spacer 260' includes ferromagnetic alloy containing at least one of the elements Co, Fe or Ni embedded in an insulating matrix of $SiO_2$ or SiC, such that the ferromagnetic material forms at least one channel (not explicitly shown) extending through the length (from top to bottom as shown in FIG. 4) of the second spacer layer 260'. The channel width is preferably between one and three nanometers and of such a length (same as thickness of the spacer) so as to allow ballistic transport of electrons. The channel also serves as site for location of sharp domain wall, when the directions of the magnetizations 257 and 273 of the layers 256 and 272, respectively, at the channel ends are antiparallel. In such an embodiment, the second spacer 260' is optimized to obtain high ballistic magneto-resistance.

The heat assisted switching layer 240' is configured such that the magnetization 235 (255) of the free layer 230' (250') is stabilized when the free layer 230' is not being switched. In a preferred embodiment, the heat assisted switching layer 240' is an antiferromagnetic layer that is exchange coupled to the ferromagnetic layers 236 and 252. In such an embodiment, the heat assisted switching layer 240' preferably has a low blocking temperature of less than two hundred degrees Celsius and preferably on the order of one hundred fifty degrees Celsius. In a preferred embodiment, the heat assisted switching layer 240' is an antiferromagnetic $Ir_xMn_{1-x}$ layer, where x is between 0.2 and 0.8. Also in a preferred embodiment, the IrMn layer 240' has a composition close to $Ir_{20}Mn_{80}$. Preferably, the fabrication (composition, thickness, seed layer and deposition conditions) of the heat assisted switching layer 240' is tailored such that the IrMn has a blocking temperature on the order of one hundred and fifty degrees Celsius or less. Thus, the blocking temperature of the heat assisted switching layer 240' is preferably less than the blocking temperature of the pinning layers 202' and 280'. Furthermore, the heat assisted switching layer 240' is configured such that the ferromagnetic layers 236 and 252 are magnetostatically coupled. The thickness of the heat assisted switching layer 240' is preferably configured to provide a significant, antiparallel coupling between the ferromagnetic layers 236 and 252. The thickness of the heat assisted switching layer 240 is preferably between five nanometers and fifteen nanometers, and in no case less than two nanometers.

In a preferred embodiment, in the three terminal configuration of the magnetic element 200, a write current is provided between terminals A and C, while a read current is provided between terminals C and B. In the two terminal configuration, both the write and read currents are provided between terminals A and B.

When the magnetic element 200' is not being written, the heat assisted switching layer 240' aids in stabilizing the magnetizations 235 and 255 of the ferromagnetic layers 236 and 252 in the direction in which they are written. Thus, the thermal stability of the magnetic element 200' is improved. In the preferred embodiment, this stabilization is accomplished because the antiferromagnetic material in the heat assisted switching layer 240' is exchange coupled to the ferromagnetic layer 236. During writing, the magnetization 235 of the ferromagnetic layer 236 may be switched. During switching, the heat assisted switching layer 240' is heated to a desired temperature and thus no longer stabilizes the magnetizations 235 and 255 of the ferromagnetic layer 236 and 252. In the preferred embodiment a low blocking temperature antiferromagnetic layer, such as one including IrMn, is used for the heat assisted switching layer 240'. In such an embodiment, the magnetic element 200' is heated such that the heat assisted switching layer 240' is at least close to, and preferably above, the blocking temperature. However, the temperature would still be below the blocking temperature of the pinning layers 202' and 280', leaving the pinned layer 210' and 270' substantially unaffected by the heating. Preferably, this heating is accomplished by resistive heating generated by the write current. Such resistive heating is described above with respect to the magnetic element 100 depicted in FIG. 2. Referring back to FIGS. 5A and 5B, because the heat assisted switching layer 240' is preferably at or above the blocking temperature of the antiferromagnetic material used for the heat assisted switching layer 240', the exchange coupling between the heat assisted switching layer 240 and the ferromagnetic layers 236 and 252 is reduced to close to zero. Thus, the magnetization 235 may be switched using a current that is substantially the same as in the absence of the heat assisted switching layer 240'. Furthermore, because of the magnetostatic coupling between the ferromagnetic layers 236 and 252, a change in the direction of magnetization of the ferromagnetic layer 236 is reflected in the ferromagnetic layer 252. Similarly, because of the coupling between the ferromagnetic layers 232 and 236 and between the ferromagnetic layers 252 and 256, respectively, the magnetizations 233 and 257, respectively, of the ferromagnetic layers 232 and 256 would also switch direction. When the write current is turned off, the heat assisted switching layer 240' cools and free layers 230' and 250' have an alignment based upon the magnetization 235 and 255, respectively, of the ferromagnetic layer 236 and 252, respectively. The heat assisted switching layer 240' can then stabilize the magnetization 235 (255) of the ferromagnetic layer 236 (252) in the new direction. Because of the magnetostatic coupling between the ferromagnetic layers 236 and 252, 236 and 232, and 252 and 256, the magnetizations 255, 233, and 257 are also stabilized. Thus, the magnetizations of the ferromagnetic layers 232, 236, 252, and 256 are stable when not being written, and can be written using approximately the same write current as in the absence of the heat assisted switching layer 240'.

Furthermore, when the three terminal configuration is used for the magnetic element 200', the write current is driven between terminals A and C. Consequently, the second spacer 260', which preferably includes an insulator, is not exposed to the higher write current. Thus, in the three terminal configuration, the magnetic element 200' is less likely to be damaged.

During reading, a read current is driven through the magnetic element 200. In a preferred, three terminal configuration, this read current is driven only between terminals B and C. In a two terminal configuration, a read current that is preferably significantly less than the write current is driven between terminals A and B. In both embodiments, the read current is low enough that it does not heat the heat assisted switching layer 240' sufficiently to break the coupling with the free layer 230' and 250' and will not inadvertently switch the magnetization of the free layer 230' or 250'. Furthermore, when the spacer layer 220' is a barrier layer or a BMR layer, the resistance and thus the signal for the magnetic element 200' is increased. Consequently, for either the two or three terminal case, the magnetic element 200' is more thermally stable when it is not being written to, can still be written using spin transfer at a relatively small write current, and still have an improved signal.

Figure 6:
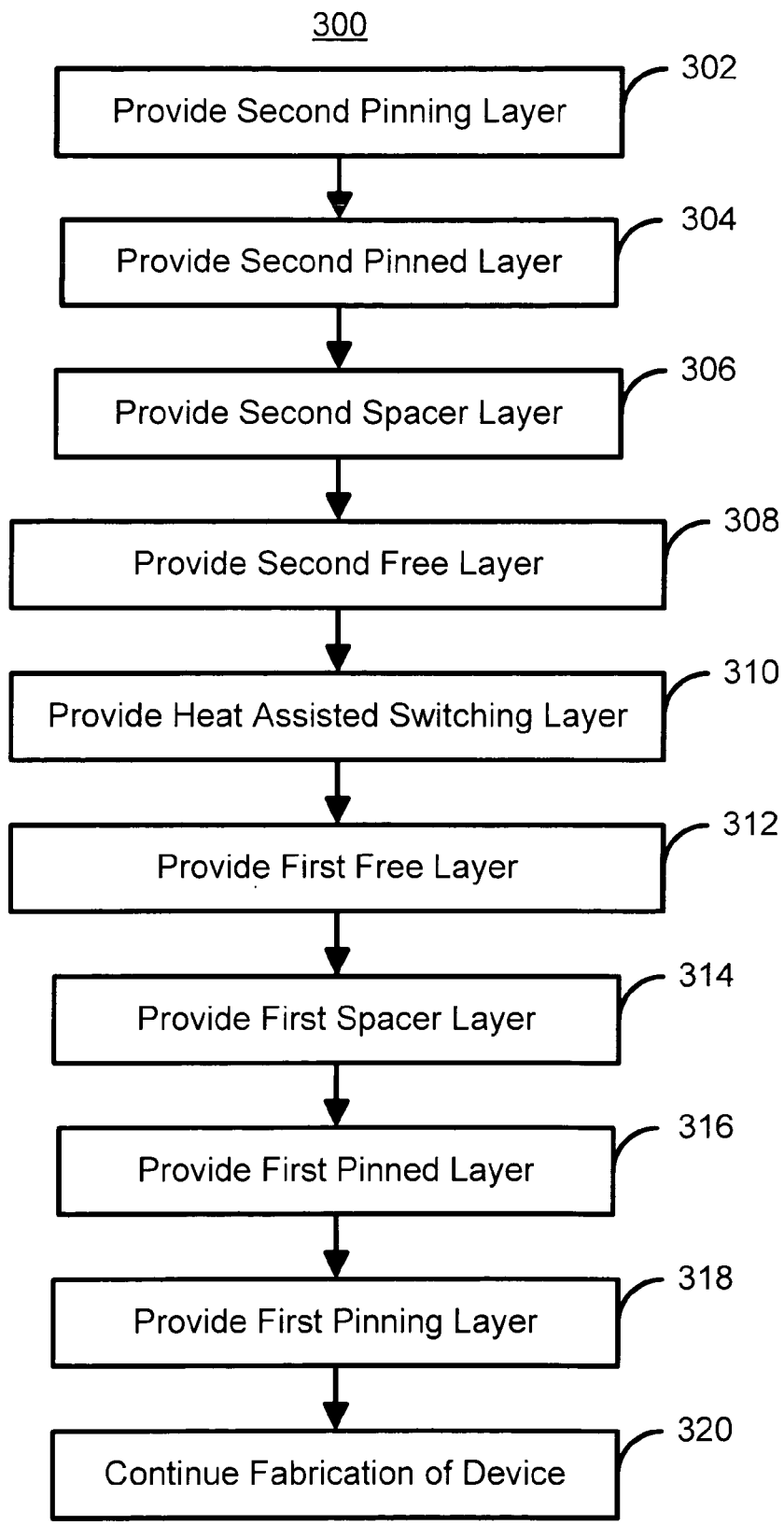
FIG. 6 is a high-level flow chart depicting one embodiment of a method in accordance with the present invention for fabricating a magnetic element in accordance with the present invention utilizing heat assisted switching.
Figure 7:
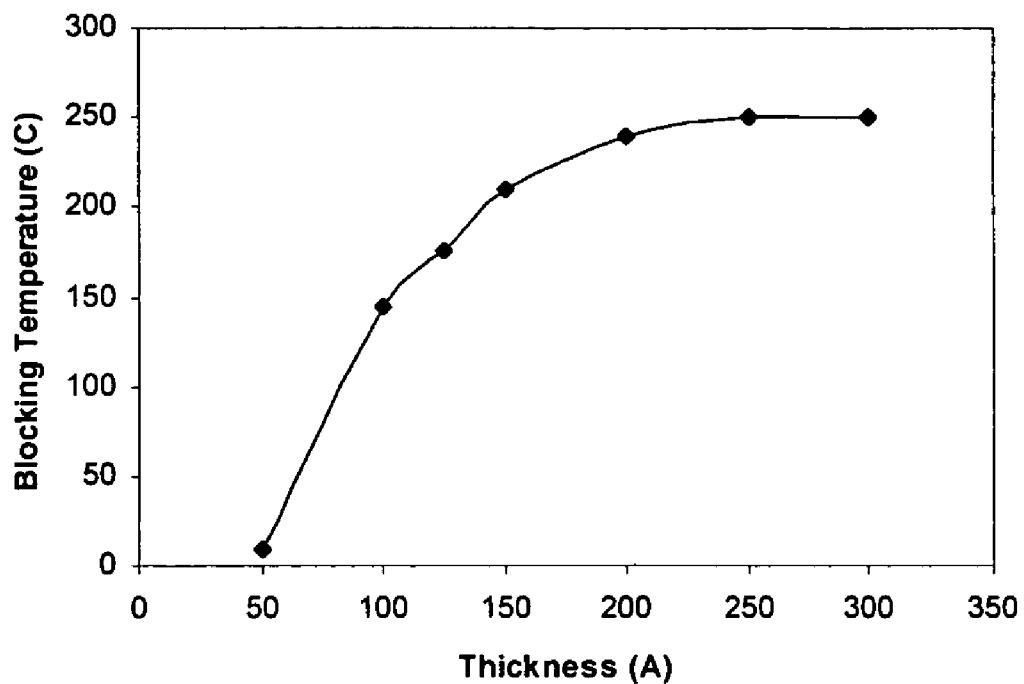
FIG. 7 is a graph depicting the blocking temperature versus thickness for one embodiment of an IrMn heat assisted switching layer.

FIG. 6 is a high-level flow chart depicting one embodiment of a method 300 in accordance with the present invention for fabricating a magnetic element in accordance with the present invention utilizing heat assisted switching. For clarity, the method 300 is described in the context of the magnetic element 200. However, the method 300 could be used for other magnetic elements, such as the magnetic element 100, 100', and 200'. Moreover, although the method 300 is described primarily in the context of a single magnetic element, one of ordinary skill in the art will readily recognize that multiple magnetic elements may be fabricated substantially simultaneously. The second pinning layer 280 is provided, via step 302. The second pinned layer 270 is provided, via step 304. In one embodiment, step 304 includes providing a synthetic pinned layer. The second spacer layer 260 is provided, via step 306. The second spacer layer 260 may be insulating or conductive. The second free layer 250 is provided, via step 308. Step 308 may thus include providing a synthetic free layer. The heat assisted switching layer 240 is provided, via step 310. Step 310 may thus include providing an IrMn layer configured to have a low blocking temperature of approximately one hundred and fifty degrees Celsius. Note that FIG. 7 depicts a graph of the blocking temperature for an IrMn layer based upon thickness. If the magnetic element 100 or 100' were being formed, then fabrication of the magnetic element itself would cease and other structures, such as the terminals, may be formed. For the magnetic element 200, however, the first free layer 230 is provided, via step 312. Step 312 may thus include providing a synthetic free layer. The spacer layer 220 is provided, via step 314. The first spacer layer 220 is preferably conductive. The first pinned layer 210 is provided, via step 316. In one embodiment, step 316 includes providing a synthetic pinned layer. The first pinning layer 202 is provided, via step 318. Formation of the magnetic memory may be continued, via step 320.

Figure 8:
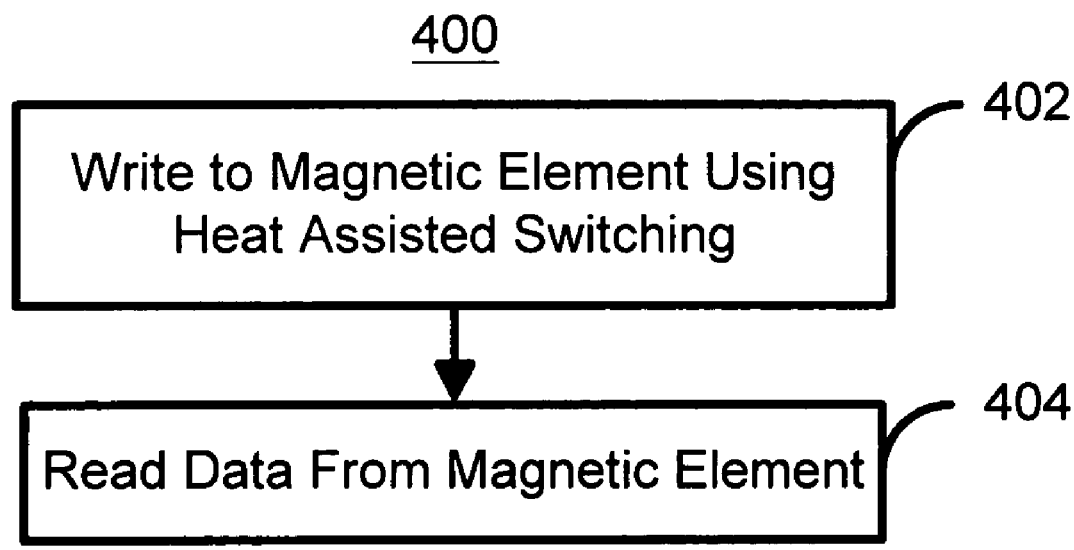
FIG. 8 is a high-level flow chart depicting one embodiment of a method in accordance with the present invention for using a magnetic element in accordance with the present invention utilizing heat assisted switching.

FIG. 8 is a high-level flow chart depicting one embodiment of a method 400 in accordance with the present invention for using to a magnetic element in accordance with the present invention utilizing heat assisted switching. For clarity, the method 400 is described in the context of the magnetic element 200. However, the method 400 could be used for other magnetic elements, such as the magnetic element 100, 100', and 200'. Moreover, although the method 400 is described primarily in the context of a single magnetic element, one of ordinary skill in the art will readily recognize that multiple magnetic elements may be read or written in parallel. The magnetic element 200 is written using heat assisted switching, via step 402. Note that in a magnetic memory (not explicitly shown), step 402 could include writing a number of magnetic elements. Step 402 thus includes heating the heat assisted switching layer 240 to the desired temperature to break the coupling between the heat assisted switching layer 240 and the free layers 230 and 250 as well as driving a current through the magnetic element 200 to write using spin transfer. In addition, the heating step performed using step 402 is configured to leave the properties of the remaining portion of the magnetic element 200 (other than the heat assisted switching layer 240) substantially unchanged. For example for the magnetic element 200', the heating would keep the temperatures of the pinning layers 202 and 280 below their blocking temperatures to ensure that the exchange coupling between the pinning layers 202 and 280 and the pinned layers 210 and 270 is note reduced to zero. In a preferred embodiment, the heating and current driving of step 402 occur together, by driving the write current for the desired time. Stated differently, the heating of step 402 is accomplished by resistive heating due to the write current driven in step 402. In a preferred embodiment, the current driven in step 402 is between the terminals A and C. However, in a two terminal device, step 402 includes driving the write current between terminals A and B. At some later time, the magnetic element 200 is read, via step 404. Step 404 includes driving a read current through the desired portion of the magnetic element 200. Thus, in a preferred embodiment, step 404 includes driving the read current between terminals C and B. However, in a two terminal device, the write current may be driven between terminals A and B. In addition, the write current driven in step 404 is preferably significantly less than the write current. Thus, the magnetic element 200 may be written to and read.

A method and system has been disclosed for providing a more thermally stable magnetic element utilizing heat assisted switching based on spin transfer. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic element comprising:
a pinned layer;
a spacer layer, the spacer layer being nonmagnetic;

a free layer, the spacer layer residing between the pinned layer and the free layer;

a heat assisted switching layer, the free layer residing between the spacer layer and the heat assisted switching layer, the heat assisted switching layer for improving a thermal stability of the free layer when the free layer is not being switched;

wherein the magnetic element is configured to allow the free layer to be switched due to spin transfer when a write current is passed through the magnetic element; and wherein the heat assisted switching layer improves the thermal stability of the free layer when the free layer is not being switched via a magnetic coupling with the free layer, the magnetic coupling being substantially reduced when the write current is passed through the magnetic element.

2. The magnetic element of claim 1 wherein the heat assisted switching layer is an antiferromagnetic layer exchange coupled to the free layer, the antiferromagnetic layer being configured to have a blocking temperature that is less than or equal to a temperature of the antiferromagnetic layer when the free layer is being switched.

3. The magnetic element of claim 2 wherein the antiferromagnetic layer includes IrMn.

4. The magnetic element of claim 3 wherein the blocking temperature is not greater than two hundred degrees Celsius.

5. The magnetic element of claim 2 further comprising:
a pinning layer adjacent to the pinned layer and including an antiferromagnetic material, the pinned layer between the pinning layer and the spacer layer, the antiferromagnetic material having a second blocking temperature greater than a temperature of the magnetic element during writing.

6. The magnetic element of claim 1 wherein the spacer layer further includes a barrier layer.

7. The magnetic element of claim 1 wherein the spacer layer further includes a conductive nonmagnetic layer.

8. The magnetic element of claim 1 wherein the pinned layer further includes a first ferromagnetic layer, a second ferromagnetic layer, and a conductive nonmagnetic spacer layer between the first ferromagnetic layer and the second ferromagnetic layer, the conductive nonmagnetic spacer layer, the first ferromagnetic layer, and the second ferromagnetic layer being configured such that the first ferromagnetic layer and the second ferromagnetic layer are antiferromagnetically coupled.

9. The magnetic element of claim 1 wherein the free layer further includes a first ferromagnetic layer, a second ferromagnetic layer, and a conductive nonmagnetic spacer layer between the first ferromagnetic layer and the second ferromagnetic layer, the conductive nonmagnetic spacer layer, the first ferromagnetic layer, and the second ferromagnetic layer being configured such that the first ferromagnetic layer and the second ferromagnetic layer are antiferromagnetically coupled.

10. A magnetic element comprising:
a first pinned layer;
a first spacer layer, the first spacer layer being nonmagnetic;
a first free layer, the first spacer layer residing between the first pinned layer and the first free layer;
a heat assisted switching layer, the first free layer residing between the first spacer layer and the heat assisted switching layer, the heat assisted switching layer for improving a thermal stability of the first free layer when the first free layer is not being switched, the heat assisted switching layer is at least two nanometers thick;
a second free layer, the heat assisted switching layer residing between the first free layer and the second free layer, the first free layer and the second free layer being magnetostatically coupled;
a second spacer layer, the second spacer layer being nonmagnetic;
a second pinned layer, the second spacer layer residing between the second free layer and the second pinned layer;
wherein the magnetic element is configured to allow the first free layer to be switched due to spin transfer when a write current is passed through the magnetic element; and
wherein the heat assisted switching layer improves the thermal stability of the first free layer when the first free layer is not being switched via a magnetic coupling with the first free layer, the magnetic coupling being substantially reduced when the write current is passed through the magnetic element.

11. The magnetic element of claim 10 wherein the first spacer layer is a conductive nonmagnetic layer.

12. The magnetic element of claim 10 wherein the first spacer layer is a barrier layer.

13. The magnetic element of claim 10 wherein the second spacer layer is a barrier layer.

14. The magnetic element of claim 10 wherein the second spacer layer is a conductive nonmagnetic layer.

15. The magnetic element of claim 10 wherein the second spacer layer is a magnetic current confined layer allowing ballistic magnetoresistance to occur between the second free layer and the second pinned layer.

16. The magnetic element of claim 10 wherein the heat assisted switching layer is an antiferromagnetic layer exchange coupled to the first free layer and the second free layer, the antiferromagnetic layer being configured to have a blocking temperature that is less than or equal to a temperature of the antiferromagnetic layer when the first free layer is being switched.

17. The magnetic element of claim 16 wherein the antiferromagnetic layer includes IrMn.

18. The magnetic element of claim 17 wherein the blocking temperature is not greater than two hundred degrees Celsius.

19. The magnetic element of claim 16 further comprising:
a first pinning layer adjacent to the first pinned layer and including an antiferromagnetic material, the first pinned layer between the first pinning layer and the first spacer layer, the antiferromagnetic material having a second blocking temperature greater than a temperature of magnetic element during writing.

20. The magnetic element of claim 16 further comprising:
a second pinning layer adjacent to the second pinned layer and including an antiferromagnetic material, the second pinned layer between the second pinning layer and the second spacer layer, the antiferromagnetic material having a second blocking temperature greater than a temperature of the magnetic element during writing.

21. The magnetic element of claim 10 wherein the first pinned layer further includes a first ferromagnetic layer, a second ferromagnetic layer, and a conductive nonmagnetic spacer layer between the first ferromagnetic layer and the second ferromagnetic layer.

22. The magnetic element of claim 21 wherein the second pinned layer further includes a third ferromagnetic layer, a fourth ferromagnetic layer having a first magnetization, and a second conductive nonmagnetic spacer layer residing between the third ferromagnetic layer and the fourth ferromagnetic layer, the second ferromagnetic layer being adjacent to the first spacer layer, the third ferromagnetic layer being adjacent to the second spacer layer, the first ferromagnetic layer having a first magnetization, the second ferromagnetic layer having a second magnetization parallel to the first magnetization.

23. The magnetic element of claim 10 wherein the first free layer further includes a first ferromagnetic layer, a second ferromagnetic layer, and a conductive nonmagnetic spacer layer between the first ferromagnetic layer and the second ferromagnetic layer.

24. The magnetic element of claim 10 wherein the second pinned layer further includes a first ferromagnetic layer, a second ferromagnetic layer, and a conductive nonmagnetic spacer layer between the first ferromagnetic layer and the second ferromagnetic layer.

25. The magnetic element of claim 10 wherein the second free layer further includes a first ferromagnetic layer, a second ferromagnetic layer, and a conductive nonmagnetic spacer layer between the first ferromagnetic layer and the second ferromagnetic layer.

26. A method of providing magnetic element comprising:
    (a) providing a pinned layer;
    (b) providing a spacer layer, the spacer layer being nonmagnetic;
    (c) providing a free layer, the spacer layer residing between the pinned layer and the free layer;
    (d) providing a heat assisted switching layer, the free layer residing between the spacer layer and the heat assisted switching layer, the heat assisted switching layer for improving a thermal stability of the free layer when the free layer is not being switched, and the heat assisted switching layer improving the thermal stability of the free layer when the free layer is not being switched via a magnetic coupling with the free layer, the magnetic coupling being substantially reduced when the write current is passed through the magnetic element;
    wherein the magnetic element is configured to allow the free layer to be switched due to spin transfer when a write current is passed through the magnetic element; and
    wherein the heat assisted switching layer improves the thermal stability of the free layer when the free layer is not being switched via a magnetic coupling with the free layer, the magnetic coupling being substantially reduced when the write current is passed through the magnetic element.

27. The method of claim 26 wherein the heat assisted switching layer is an antiferromagnetic layer exchange coupled to the free layer, the antiferromagnetic layer being configured to have a blocking temperature that is less than or equal to a temperature of the antiferromagnetic layer when the free layer is being switched.

28. The method of claim 27 wherein the antiferromagnetic layer includes IrMn.

29. The method claim of 28 wherein the blocking temperature is not greater than two hundred degrees Celsius.

30. A method for providing magnetic element comprising:
    (a) providing a first pinned layer;
    (b) providing a first spacer layer, the first spacer layer being nonmagnetic;
    (c) providing a first free layer, the first spacer layer residing between the first pinned layer and the first free layer;
    (d) providing a heat assisted switching layer, the first free layer residing between the first spacer layer and the heat assisted switching layer, the heat assisted switching layer for improving a thermal stability of the first free layer when the first free layer is not being switched;
    (e) providing a second free layer, the heat assisted switching layer residing between the first free layer and the second free layer, the first free layer and the second free layer being magnetostatically coupled;
    (f) providing a second spacer layer, the second spacer layer being nonmagnetic;
    (g) providing a second pinned layer, the second spacer layer residing between the second free layer and the second pinned layer;
    wherein the magnetic element is configured to allow the first free layer to be switched due to spin transfer when a write current is passed through the magnetic element; and
    wherein the heat assisted switching layer improves the thermal stability of the first free layer when the first free layer is not being switched via a magnetic coupling with the first free layer, the magnetic coupling being substantially reduced when the write current is passed through the magnetic element.

31. A method for utilizing a magnetic element in a magnetic memory comprising:
    heating a portion of the magnetic element during switching of the magnetic element, the magnetic element including a pinned layer, a spacer layer, a free layer, and a heat assisted switching layer, the free layer residing between the spacer layer and the heat assisted switching layer, the heat assisted switching layer for improving a thermal stability of the free layer when the free layer is not being switched, the spacer layer being nonmagnetic and layer residing between the pinned layer and the free layer, the portion being heated including the heat assisted switching layer; and
    applying a read current for reading the magnetic element;
    wherein the magnetic element is configured to allow the free layer to be switched due to spin transfer when a write current is passed through the magnetic element.

32. The method of claim 31 wherein the heating step includes the step of:
    applying a write current to the magnetic element, the write current being used to heat the portion of the magnetic element.

33. The magnetic element of claim 1 wherein the heat assisted switching layer substantially covers the free layer.

34. The magnetic element of claim 1 wherein the heat assisted switching layer substantially covers the first free layer.

35. The method of claim 31 wherein the heat assisted switching layer improves the thermal stability of the free layer when the free layer is not being switched via a magnetic coupling with the free layer, the magnetic coupling being substantially reduced when the magnetic element is heated.

* * * * *